| (12) | United States Patent | (10) Patent No.: | US 9,177,521 B2 |
|---|---|---|---|
| | Moriwaki | (45) Date of Patent: | Nov. 3, 2015 |

(54) ELECTRONIC DEVICE

(75) Inventor: Hiroyuki Moriwaki, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 1005 days.

(21) Appl. No.: 13/375,999

(22) PCT Filed: Feb. 24, 2010

(86) PCT No.: PCT/JP2010/001257
§ 371 (c)(1),
(2), (4) Date: Dec. 2, 2011

(87) PCT Pub. No.: WO2010/143336
PCT Pub. Date: Dec. 16, 2010

(65) Prior Publication Data
US 2012/0081344 A1     Apr. 5, 2012

(30) Foreign Application Priority Data

Jun. 9, 2009     (JP) ................... 2009-138566

(51) Int. Cl.
*H01L 25/00*     (2006.01)
*G09G 3/36*     (2006.01)
(Continued)

(52) U.S. Cl.
CPC ............ *G09G 3/3677* (2013.01); *G09G 3/006* (2013.01); *G09G 3/3688* (2013.01); *G11C 19/00* (2013.01); *G09G 2300/0408* (2013.01); *G09G 2310/0286* (2013.01); *G09G 2330/08* (2013.01)

(58) Field of Classification Search
CPC . H01L 27/0207; H01L 27/088; H01L 27/092; G09G 3/20; G09G 3/2011; G09G 3/2927; G09G 3/3648; G09G 2330/021; G01R 31/026; G01R 31/025; G01R 31/08; G01R 31/088; G01R 31/021

USPC .................. 327/564–566; 345/208, 204, 205; 324/500, 512, 522, 523, 527, 528, 531, 324/537, 538–544, 550, 551, 557
See application file for complete search history.

(56) References Cited

U.S. PATENT DOCUMENTS 4,820,222 A     4/1989 Holmberg et al.
5,369,646 A     11/1994 Shikatani
(Continued)

FOREIGN PATENT DOCUMENTS

GB     2 342 213 A     4/2000
JP     58-138064 A     8/1983
(Continued)

OTHER PUBLICATIONS

Official Communication issued in International Patent Application No. PCT/JP2010/001257, mailed on Mar. 30, 2010.

*Primary Examiner* — Lincoln Donovan
*Assistant Examiner* — Thomas Skibinski
(74) *Attorney, Agent, or Firm* — Keating & Bennett, LLP

(57) ABSTRACT

An electronic device of the present invention includes a shift register SR provided integrally with a substrate, a first line 11 connected with a connection terminal 101 electrically connectable with an outside device provided independently of the shift registers SR, second lines 12a through 12c via which output waveforms of the shift register SR are extracted, and switching sections 13a through 13c by which the first line 11 and the second lines 12a through 12c are switched between an electrically connected condition and an electrically disconnected condition. With this, even in a case where the electronic device of the present invention is a liquid crystal display device having a driver monolithic structure, output waveforms of a drive circuit (electronic circuit) can be inspected.

30 Claims, 12 Drawing Sheets

(51) Int. Cl.
*G09G 3/00* (2006.01)
*G11C 19/00* (2006.01)

(56) References Cited

U.S. PATENT DOCUMENTS

| | | | |
|---|---|---|---|
| 5,412,593 A * | 5/1995 | Magel et al. | 365/96 |
| 5,565,801 A | 10/1996 | Ernst | |
| 6,580,411 B1 | 6/2003 | Kubota et al. | |
| 6,747,627 B1 | 6/2004 | Koyama et al. | |
| 6,943,764 B1 | 9/2005 | Koyama et al. | |
| 7,196,699 B1 | 3/2007 | Kubota et al. | |
| 2001/0040565 A1 * | 11/2001 | Koyama | 345/204 |
| 2005/0057556 A1 | 3/2005 | Kubota et al. | |
| 2005/0259060 A1 | 11/2005 | Koyama et al. | |
| 2006/0156111 A1 * | 7/2006 | Nozawa | 714/724 |
| 2009/0046049 A1 | 2/2009 | Koyama et al. | |

FOREIGN PATENT DOCUMENTS

| | | | |
|---|---|---|---|
| JP | 6-216253 A | | 8/1994 |
| JP | 7-312390 A | | 11/1995 |
| JP | 8-8728 A | | 1/1996 |
| JP | 2000-40792 A | | 2/2000 |
| JP | 2000040792 A | * | 2/2000 |
| JP | 2000-187994 A | | 7/2000 |
| JP | 2001-330650 A | | 11/2001 |
| JP | 2002116423 A | * | 4/2002 |
| JP | 2004-198671 A | | 7/2004 |
| WO | 00/49421 A1 | | 8/2000 |

* cited by examiner

F I G. 5
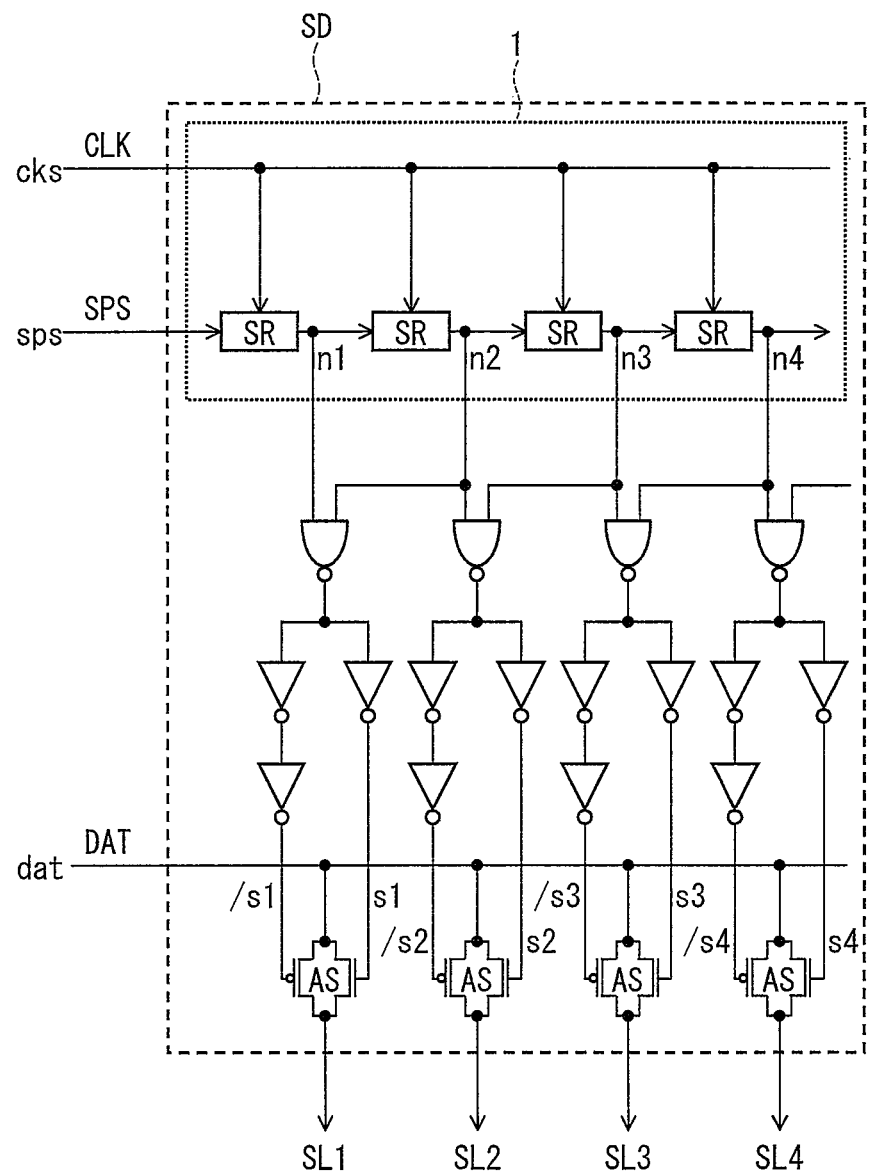

F I G. 1 0
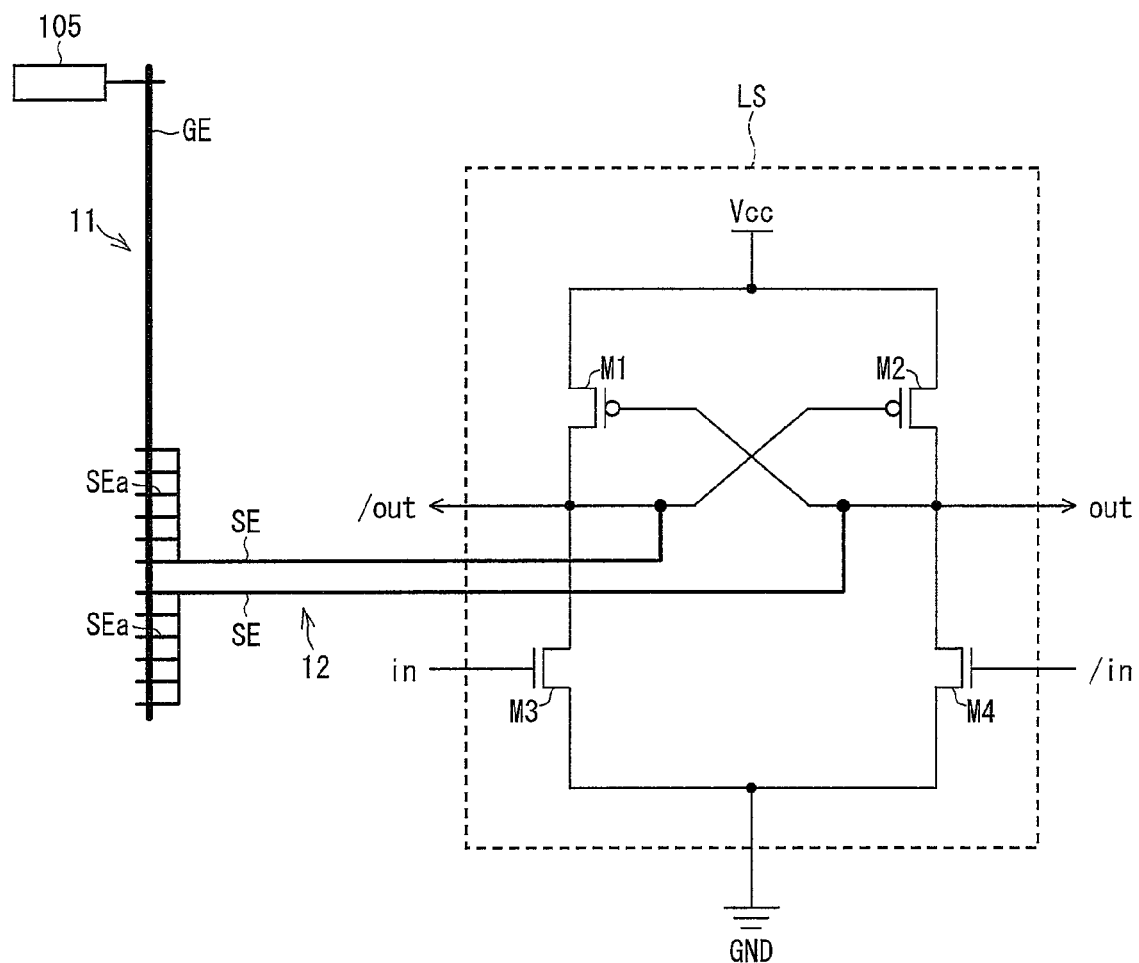

ELECTRONIC DEVICE

TECHNICAL FIELD

The preset invention relates to an electronic device including an electronic circuit and relates particularly to an electronic device including the following (i) through (iii) which are provided integrally with a same substrate; (i) a display panel, (ii) a device such as the display panel, and (iii) an electronic circuit which serves as a drive circuit for driving the device.

BACKGROUND ART

In order for a device size to be small and installation cost to be reduced, there has been recently proposed an electronic device in which a display panel and a drive circuit (electronic circuit) for driving the display panel are provided integrally with a same substrate, i.e., a liquid crystal display device having a so-called monolithic structure (see Patent Literature 1, for example).

CITATION LIST

Patent Literature

Patent Literature 1
Japanese Patent Application Publication, Tokukai, No. 2000-187994 A (Publication Date: Jul. 4, 2000)

SUMMARY OF INVENTION

Technical Problem

In a liquid crystal display device having a driver monolithic structure, a substrate and a counter substrate are attached to each other so that drive circuits are housed in a space surrounded by sheets of glass. Further, in order for a circuit density to be improved, line widths in the drive circuits are usually very narrow (few micrometers to several tens of micrometers). Besides, lines are covered by an insulating film. Such a configuration of the liquid crystal display device, however, makes it very difficult to directly touch the lines with prove pins so as to inspect output waveforms of the drive circuits by an outside device such as an oscilloscope or the like. Accordingly, the liquid crystal display device having the driver monolithic structure has a drawback that, even in a case where a failure is detected when the liquid crystal display device is inspected after manufacturing, no output waveform of the drive circuits can be inspected. Consequently, it is impossible to identify a cause of the failure. This gives a rise to a problem that a yield ratio of liquid crystal display devices is decreased.

The present invention is made in view of the problem, and an object of the present invention is to provide an electronic device configured so that, even in a case where the electronic device is a liquid crystal display device having a driver monolithic structure, it is possible that output waveforms of drive circuits (electronic circuits) are inspected.

Solution to Problem

In order to attain the object, an electronic device of the present invention includes: an electronic circuit provided integrally with a substrate; a first line connected with a connection terminal electrically connectable with an outside device provided independently of the electronic circuit; a second line via which an output waveform of the electronic circuit is extracted to an outside of the electronic circuit; and a switching section by which the first line and the second line are switched between an electrically connected condition and an electrically disconnected condition for predetermined times.

The "predetermined times" of switching above is counted by counting the following switching (i) as first switching and counting next switching (ii) as second switching; (i) switching of the first line and the second line from the electrically disconnected condition to the electrically connected condition (or switching of them from the electrically connected condition to the electrically disconnected condition), and (ii) switching of the first line and the second line from the electrically connected condition to the electrically disconnected condition (or switching of them from the electrically disconnected condition to the electrically connected condition).

According to the configuration, the electronic device of the present invention includes the switching section by which the first line, which is connected with the connection terminal electrically connectable with the outside device provided independently of the electronic circuit, and the second line, which is for extracting the output waveform of the electronic device, are switched between the electrically connected condition and the electrically disconnected condition for the predetermined times. Thus, by simply performing, in the switching section, the predetermined times of switching of the first line and the second line between the electrically connected condition and the electrically disconnected condition, it is possible to feed the output waveform of the electronic circuit, which is extracted via the second line, to the outside device provided independently of the electronic circuit, as many times as the number of times that the first line and the second lines are switched to the electrically connected condition out of the predetermined times of switching of the first line and the second line between the electrically connected condition and the electrically disconnected condition.

The lines for extracting the output waveform of the electronic circuit and the connection terminal via which the output waveform of the electronic circuit is extracted are thus provided independently of the electronic circuit. With this, it is possible that the output waveform of the electronic circuit is surely inspected, even in a case where the electronic circuit is provided integrally with the substrate, i.e., the electronic circuit has a so-called monolithic structure.

Thus, even if the electronic circuit has the monolithic structure, it is possible that, in a case where a failure is detected in an inspection phase, the output waveform of the electronic circuit is inspected. Thus, it is possible to identify a cause of the failure. This in turn enables improving a yield ratio of the electronic device.

The electronic device of the present invention is configured so that in a case where (i) the first line has a branch line branched from a main line and the second line has two or more cross lines crossing the branch line in the switching section, or (ii) the first line has a branch line branched from a main line, the branch line having two or more cross lines crossing the second line in the switching section, the two or more cross lines are electrically connectable with the branch line or the second line on a one-by-one basis.

According to the configuration, the two or more cross lines of the second line or the two or more cross lines of the branch line are electrically connectable with the branch line or the second line on the one-by-one basis. With this, it is possible that an output waveform at a same location in the electronic circuit is inspected for two or more times.

The electronic device of the present invention is configured so that in the case (i) or (ii), the two or more cross lines are provided above or below the branch line or the second line with an insulating film being disposed between the two or more cross lines and the branch line or the second line.

According to the configuration, the two or more cross lines are provided above or below the branch line or the second line with the insulating film being disposed between the two or more cross lines and the branch line or the second line. With this, by performing laser welding or the like to intersections of the two or more cross lines and the branch line or the second line, it is possible to electrically connect the two or more cross lines and the branch line or the second line with each other.

The electronic device of the present invention is configured so that: the second line includes second lines provided for different types of output waveforms of the electronic circuit; the first line has branch lines branched from a main line, the number of the branch lines being equal to or greater than the number of the second lines; and the second lines are connectable with the branch lines in respective switching sections.

According to the configuration, the second lines are electrically connectable with the branch lines of the first line on the one-by-one basis. With this, different output waveforms of the electronic circuit can be obtained for one or more times.

With the configuration, furthermore, even if the number of extraction targets is increased, it is required that only the number of the second lines is increased, while the number of the main line of the first line can be one irrespective of the increase in the number of the extraction targets. This can prevent a decrease in a circuit density.

The electronic device of the present invention is configured so that the branch lines are provided so as to cross the main line of the first line, with an insulating film being disposed between the branch lines and the main line of the first line.

According to the configuration, the branch lines and the main line of the first line are prevented from being electrically connected with each other, before it is required that they are electrically connected with each other. With this, an unnecessary signal inputted from the connection terminal connected with the outside device is hardly inputted to the second lines via the main line of the first line. As such, it is less likely that an adverse influence by the unnecessary signal is exerted on the electronic circuit on a downstream side.

The electronic device of the present invention is configured so that the main line of the first line crosses a terminal line with an insulating film being disposed between the main line of the first line and the terminal line, the terminal line being connected with the connection terminal.

According to the configuration, the terminal line and the main line of the first line are prevented from being electrically connected with each other, before it is required that they are electrically connected with each other. With this, no unnecessary signal inputted from the connection terminal connected with the outside device is inputted via the main line. As such, it is less likely that an adverse influence by the unnecessary signal is exerted on the electronic device on a downstream side.

The electronic device of the present invention is configured so that each second line crosses a leading line with an insulating film being disposed between the second line and the leading line, the leading line being electrically connected with a corresponding line on which the output waveform to be extracted from the electronic circuit is applied.

According to the configuration, each second line and the leading line of the electronic circuit are prevented from being electrically connected with each other, before it is required that they are electrically connected with each other. As such, no unnecessary signal can be inputted to the electronic circuit via the second line. Thus, it is less likely that an adverse influence by the unnecessary signal is exerted on the electronic circuit.

The electronic device of the present invention is configured so that the leading line has such a length that a capacitance formed at an intersection of the leading line and the second line is not greater than a predetermined value.

According to the configuration, the leading line thus has such a length that the capacitance formed at the intersection of the leading line and the second line is not greater than the predetermined value. This enables minimizing the adverse influence by the capacitance formed at the above intersection.

The electronic device of the present invention is configured so that the electronic circuit includes electronic circuits connected with each other in series, the first line and the second line(s) are provided to an electronic circuit at a last stage of the serial connection of the electronic circuits.

The electronic device of the present invention is configured so that the electronic circuit includes electronic circuits connected with each other in series, the first line and the second line(s) are provided to an electronic circuit at a first stage of the serial connection of the electronic circuits.

Generally, in a case where the electronic circuits are connected with each other in series, a result of inspecting of an output waveform of an electronic circuit at a first stage of the serial connection of the electronic circuits is equal to a result of inspecting of a normal operation of the electronic circuit, and a result of inspecting of an output waveform of an electronic circuit at a last stage of the serial connection of the electronic circuits is equal to a result of inspecting of an output waveform whose waveform change is most significant among other output waveforms in an entire group of the electronic circuits.

It is preferable that the electronic circuit is a shift register, for example.

An electronic device of the present invention includes an electronic circuit, signal lines connected respectively with a source electrode, a drain electrode, and a gate electrode of a transistor included in the electronic circuit, each of the signal lines being diverged into a first branch line and a second branch line, the first branch line being connected with a connection terminal electrically connectable with an outside device; and switching sections by each of which a corresponding one of the second branch lines and a line for supplying a signal to or outputting a signal from the source electrode, the drain electrode, or the gate electrode of the transistor are switched between an electrically connected condition and an electrically disconnected condition.

With the configuration, the signal supplied to and outputted from the electrodes of the transistor can be obtained from the connection terminal. Therefore, in a case where a failure of the electronic circuit is detected, it is easy to identify a cause of the failure.

The electronic device of the present invention is configured so that: each of the lines for supplying the signal to or outputting the signal from the source electrode, the drain electrode, or the gate electrode of the transistor has a two or more cross lines crossing the corresponding one of the second branch lines in a corresponding one of the switching sections, the two or more cross lines of the each of the lines being configured to be connectable with the corresponding one of the second branch lines on a one-by-one basis; or each of the second branch lines includes two or more cross lines crossing a corresponding one of the lines for supplying the signal to or outputting the signal from the source electrode, the drain electrode, or the gate electrode of the transistor in the corresponding one of the switching sections, the two or more cross lines of the each of the second branch lines being configured to be connectable with the corresponding one of the lines on a one-by-one basis.

According to the configuration, the two or more cross lines of each of the lines is electrically connectable with the corresponding one of the second branch lines or the corresponding one of the lines. With this, the output waveforms of the respective electrodes of the transistor can be inspected for two or more times.

The electronic device of the present invention is configured so that: in a case where the each of the lines has the two or more cross lines crossing the corresponding one of the second branch lines in the corresponding one of the switching sections, the two or more cross lines of the each of the lines are provided above or below the corresponding one of the second branch lines with an insulating film being disposed between the two or more cross lines of the each of the lines and the corresponding one of the second branch lines; or in a case where the each of the second branch lines has the two or more cross lines crossing the corresponding one of the lines in the corresponding one of the switching sections, the two or more cross lines of the each of the second branch lines are provided above or below the corresponding one of the lines with an insulating film being disposed between the two or more cross lines of the each of the second branch liens and the corresponding one of the lines.

According to the configuration, in a case where each of the lines has the two or more cross lines crossing the corresponding one of the second branch lines in the corresponding one of the switching sections, the two or more cross lines of each of the lines are provided above or below the corresponding one of the second branch lines with the insulating film being disposed between the two or more cross lines of each of the lines and the corresponding one of the second branch lines. In such an event, by performing laser welding or the like to the intersections of the cross lines and the second branch lines, it is possible to establish electric continuity between the cross lines and the second branch lines. On the other hand, in a case where each of the second branch lines has the two or more cross lines crossing the corresponding one of the lines in the corresponding one of the switching sections, the two or more cross lines of the each of the second branch lines are provided above or below the corresponding one of the lines with the insulating film being disposed between the two or more cross lines of each of the second branch lines and the corresponding one of the lines. In such an event, by performing laser welding or the like to the intersections of the cross lines and the lines, it is possible to establish electric continuity between the cross lines and the lines.

It is preferable that the electronic circuit is a shift register.

The first line is disconnected at a position that is not in the switching region by which the first line is connected or disconnected with the second line.

With this, it is possible to prevent a noise and a static electricity inputted from the connection terminal connectable with the outside device from entering the electronic circuit via the first line connected with the connection terminal. Therefore, it is possible to prevent an adverse influence by the noise on the electronic circuit and electrostatic breakdown of the electronic circuit. Further, in a case where the first line is disconnected at the above position, no output waveform of the electronic circuit can be extracted via the connection terminal. Therefore, it is impossible for a third party to analyze the electronic circuit provided inside the electronic device. This enables preventing information leakage and preserving confidentiality of the configuration of the electronic circuit.

In order to surely prevent extraction of the output waveforms from the electronic circuit and to minimize a disconnection part of the first line, it is preferable to disconnect the first line at a position between the connection terminal and that one of the switching sections which is closest to the connection terminal.

Advantageous Effects of Invention

A present invention includes an electronic circuit provided integrally with a substrate, a first line connected with a connection terminal electrically connectable with an outside device provided independently of the electronic circuit, a second line via which an output waveform of the electronic circuit is extracted to an outside of the electronic circuit, and a switching section by which the first line and the second line are switched between an electrically connected condition and an electrically disconnected condition for predetermined times. Thus, even though the electronic circuit is provided integrally with the substrate, i.e., the electronic circuit has a so-called monolithic structure, it is still possible that the output waveform of the electronic circuit is surely inspected as many times as the number of times that first line and the second line are switched to the electrically connected condition, out of the predetermined times of switching of the first line and the second line between the electrically connected condition and the electrically disconnected condition.

Advantageous Effects of Invention

A present invention includes an electronic circuit provided integrally with a substrate, a first line connected with a connection terminal electrically connectable with an outside device provided independently of the electronic circuit, a second line via which an output waveform of the electronic circuit is extracted to an outside of the electronic circuit, and a switching section by which the first line and the second line are switched between an electrically connected condition and an electrically disconnected condition for predetermined times. Thus, even though the electronic circuit is provided integrally with the substrate, i.e., the electronic circuit has a so-called monolithic structure, it is still possible that the output waveform of the electronic circuit is surely inspected as many time as the number of times that the first line and the second line are switched to the electrically connected condition, out of the predetermined times of switching of the first line and the second line between the electrically connected condition and the electrically disconnected condition.

BRIEF DESCRIPTION OF DRAWINGS

FIG. 5 is a circuit view showing a configuration of a data signal line drive circuit included in the liquid crystal display device shown in FIG. 4.

FIG. 10 is a circuit view showing a configuration of a level shifter included in the drive circuit shown in FIG. 8 or 9.

DESCRIPTION OF EMBODIMENTS

Embodiment 1

One embodiment of the present invention is described below. The present embodiment describes an exemplary case that an electronic device of the present invention is applied to a drive circuit of an active matrix drive type liquid crystal display device.

Figure 4:
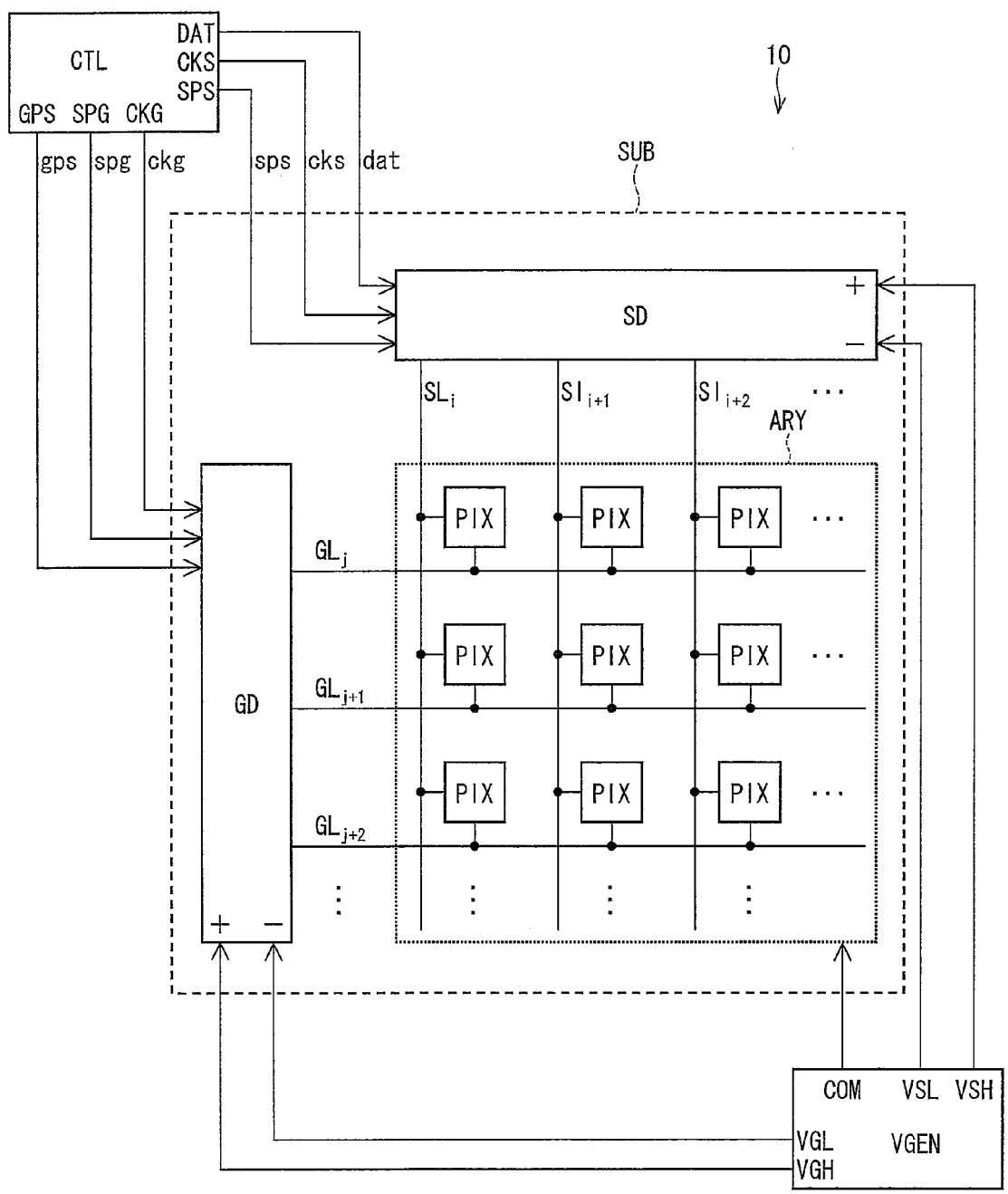
FIG. 4 is a block view schematically showing a configuration of a liquid crystal display device including the electronic device shown in FIG. 1 as a drive circuit.

FIG. 4 is a block view schematically showing an active matrix drive type liquid crystal display device 10 according to the present embodiment.

As shown in FIG. 4, the liquid crystal display device 10 includes a pixel array ARY, a scanning signal line drive circuit GD, and a data signal line drive circuit SD. In the pixel array ARY, pixels PIX are provided near respective intersections of a plurality of scanning signal lines GL and a plurality of data signal lines SL crossing each other. The pixels PIX are arranged in a matrix pattern. Each of the pixels PIX is connected with a closet one of the plurality of the scanning signal lines GL and a closest one of the plurality of data signal lines SL.

The liquid crystal display device 10 has a so-called driver monolithic structure so that the pixel array ARY, the data signal line drive circuit SD, and the scanning signal line drive circuit GD are provided on a same substrate SUB. In the liquid crystal display device 10, liquid crystals are driven according to signals supplied from an outside control circuit CTRL and drive powers applied from an outside power source circuit VGEN, the signals supplied from the output control circuit CTRL being a video signal dat, a clock signal cks, a start signal sps, a clock signal ckg, a start signal spg, and a pulse width control signal gps.

The data signal line drive circuit SD is synchronized with a timing signal such as the clock signal cks or the like, samples the signal dat that is inputted to the data signal line drive circuit SD, amplifies the video signal dat if necessary and applies it to the plurality of data signal lines SL. The scanning signal line drive circuits GD is synchronized with a timing signal such as the clock signal ckg or the like, and selects the plurality of scanning signal lines sequentially so as to control opening and closing of switching elements in the pixels PIX.

As such, the video signal (data) dat applied to the plurality of data signal lines SL is written down into the pixels PIX on a selected row and retained.

Although it is not illustrated, each of the pixels PIX generally includes an electric field transistor serving as the switching element and a pixel capacitor made up of a liquid crystal capacitor and a storage capacitor (which is added if necessary). A first electrode of the pixel capacitor is connected with a corresponding one of the plurality of data signal lines SL via a drain and a source of the transistor. A gate of the transistor is connected with a corresponding one of the plurality of scanning signal lines GL. A second electrode of the pixel capacitor is connected with a common electrode shared by all of the pixels PIX.

FIG. 5 is a block view schematically showing the data signal line drive circuit SD.

As shown in FIG. 5, the data signal line drive circuit SD includes a shift register circuit 1 made up of a plurality of shift registers SR, a buffer circuit made up of a plurality of NAND circuits and a plurality of NOT circuits, and a plurality of analog switch circuits AS provided for the respective corresponding plurality of shift registers SR.

In the buffer circuit, each NAND circuit receives output signals n (n1, n2, n3, n4, . . . ) of corresponding adjacent two of the plurality of shift registers SR forming the shift register circuit 1. The output signals n thus received are amplified. Then, inversion signals of the output signals n are generated by the plurality of NOT circuits, if necessary. In such an event, sampling signals s (s1, s2, s3, s4, . . . ) and the inversion signals (/s1, /s2, /s3, /s4, . . . ) of the sampling signals are outputted to the plurality of analog switch circuits (sampling circuits) AS.

The plurality of analog switch circuits AS are opened and closed in response to the sampling signals s and the inversion signals /s so that the video data sent via video signal lines DAT are supplied to the plurality of data signal lines SL.

Figure 6:
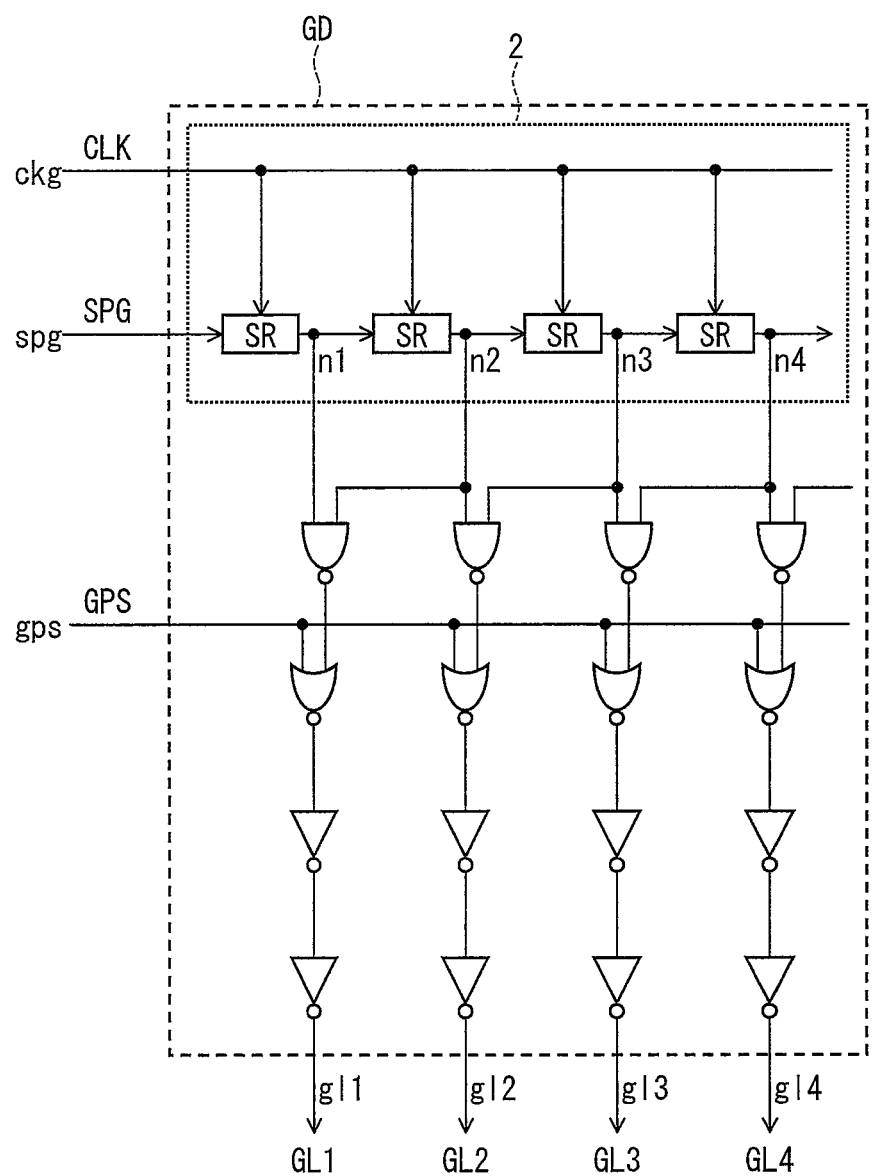
FIG. 6 is a circuit view showing a configuration of a scanning signal line drive circuit included in the liquid crystal display device shown in FIG. 4.

FIG. 6 is a block view schematically showing a configuration of the scanning signal line drive circuit GD.

As shown in FIG. 6, the scanning signal line drive circuit GD includes (i) a shift register circuit 2 made up of a plurality of shift registers SR and (ii) a buffer circuit made up of a plurality of NAND circuits, NOR circuits, and NOT circuits.

In the buffer circuit, each NAND circuit receives output signals n (n1, n2, n3, n4, . . . ) of corresponding adjacent two of the plurality of shift registers SR forming the shift register circuit 2. The output signals n thus received are added with the pulse width control signal gps supplied from an outside, so that desired pulse widths of the output signals n are obtained by the plurality of NOT circuits.

Figure 11:
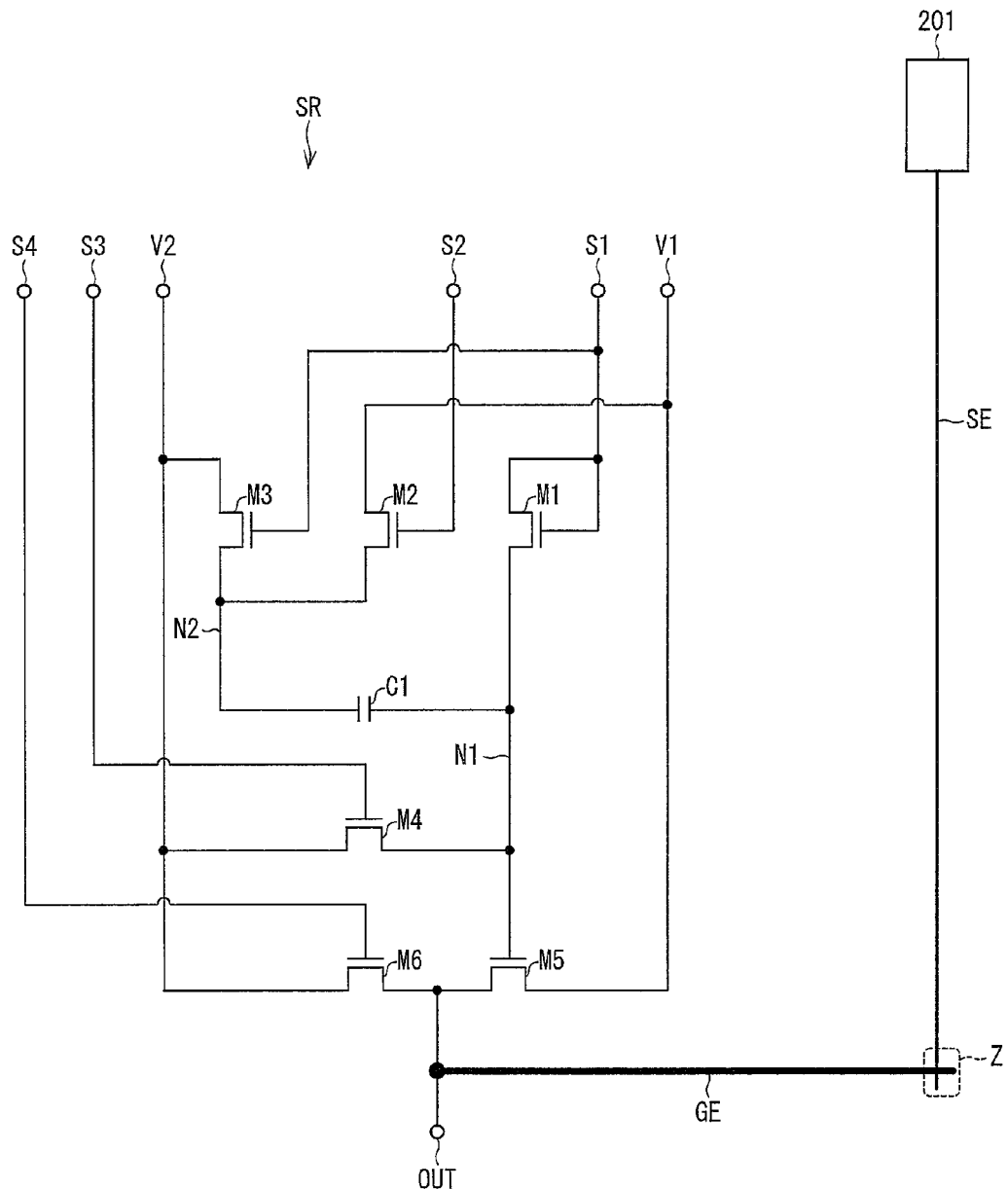
FIG. 11 is a circuit view showing a configuration of an electronic device which is a comparative example to the present invention.

The plurality of shift registers SR forming the shift register circuit 1, which is a constituent of the scanning signal line drive circuit GD, have configurations as shown in FIG. 11, for example. Likely, the plurality of shift registers SR forming the shift register circuit 2 of the data signal line drive circuit SD have configurations similar to the plurality of shift registers SR forming the shift register circuit 1.

Each of the plurality of shift registers SR of the shift register circuit 2 includes (i) six switching elements M1 through M6 each formed by a thin film transistor and (ii) one capacitor C1. The plurality of shift register SR of the shift register circuit 2 output pulse generated therein to the gate lines of the pixel array ARY via the NAND circuits of the scanning signal line drive circuit GD.

The switching elements M1 through M6 operate in response to inputted gate clocks S1 through S4, a voltage V1 which is a drive voltage VGL applied from the outside power source circuit VGEN, and a voltage V2 which is a drive voltage VGH, so as to generate gate pulses for driving the pixel array ARY. The gate pulses thus generated are outputted from an output terminal OUT.

As shown in FIG. 4, the liquid crystal display device of the present embodiment has the so-called driver monolithic structure so that the pixel array ARY for display control, the data signal line drive circuit SD, and the scanning signal line drive circuit GD are provided integrally with the same substrate SUB. Thus, in order for a circuit density to be improved, line widths in the drive circuits are generally very narrow (from few micrometer to several tens of micrometer). Further, the lines are protected by an insulating film. For these reasons, it is difficult to touch the lines with a probe pin so as to inspect output waveforms by an outside device such as an oscilloscope or the like.

As a countermeasure to this difficulty, the shift register SR shown in FIG. 11 includes a plurality of test lines (hereinafter referred to as a test line group) which (i) are provided independently of the switching elements M1 through M6 forming the shift register SR and (ii) are electrically connectable with the outside device such as an oscilloscope or the like.

The test line group includes a first line SE connected with a connection terminal 201 electrically connectable with the outside device and a second line GE electrically connected with the output terminal OUT of the shift register SR.

Figure 12:
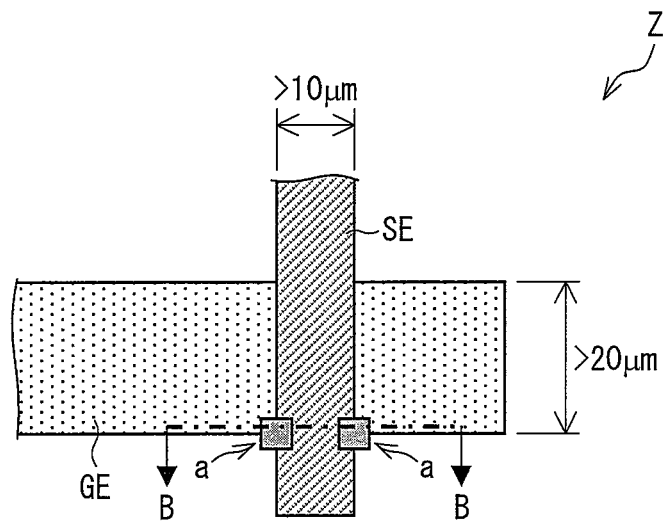
FIG. 12 is an enlarged view showing a main part of the electronic device shown in FIG. 11.
Figure 13:
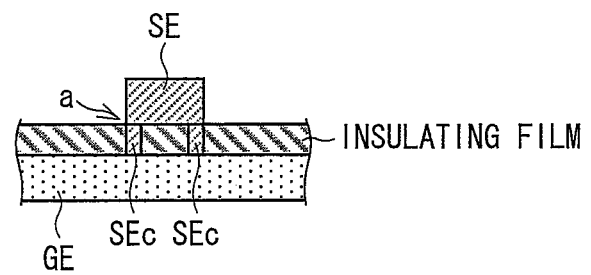
FIG. 13 is a cross sectional view of the electronic device shown in FIG. 12, taken along the line BB in FIG. 12.

A first end part of the first line SE and a first end part of the second line GE cross each other via an insulating film (which is not illustrated). The first end part of the first line SE is an opposite end part to a second end part extended toward the connection terminal 201, whereas the first end part of the second line GE is an opposite end part to a second end part connected with the output terminal OUT. FIG. 12 is an enlarged view showing a region indicated by the reference sign Z in FIG. 11. FIG. 13 is a cross sectional view taken along the line BB in FIG. 12.

The first line SE is (i) made from a same material as source electrodes of the switching elements forming the shift register SR and (ii) formed by same forming steps as the source electrodes of the switching elements. On the other hand, the second line GE is (i) made from a same material as gate electrodes of the switching elements forming the shift register SR and (ii) formed by same forming steps as the gate electrodes of the switching elements. Accordingly, the first line SE and the second line GE are provided so as to partially cross each other via the insulting film. An example illustrated in FIG. 12 shows a case in which the first line SE has a line width of 10 μm and the second line GE has a line width of 20 μm.

Welding regions a of the intersection part Z, which are located in an intersection of the first line SE and the second lines GE crossing each other via the insulting film, are subjected to laser welding so as to be shortcut as shown in FIGS. 12 and 13. This causes electrical connection between the first line SE and the second line GE in parts SEc. As such, it is possible that the output pulse of the shift register SR is obtained from the connection terminal 201 via the second line GE and the first line. For example, it is possible that the connection terminal 201, which is contactable with a probe pin, and the first line SE and the second line GE, which serve as output lines, are conductive with each other.

With the configuration, it is possible that the output waveform to the gate line is inspected. This enables determining whether the output waveform of the shift register SR is normal or not.

With the configuration, furthermore, if an operation failure by the shift register SR is detected, an output waveform may be inputted from an outside so that a waveform can be inputted to a pixel.

With the configuration, as understood from the above, it is easy to inspect the output pulse at the output terminal OUT of the shift register SR. However, because the shift register SR of the driver monolithic drive circuit is covered by an insulating film, it is difficult to inspect output waveforms of the respective switching elements forming the shift register SR.

Figure 14:
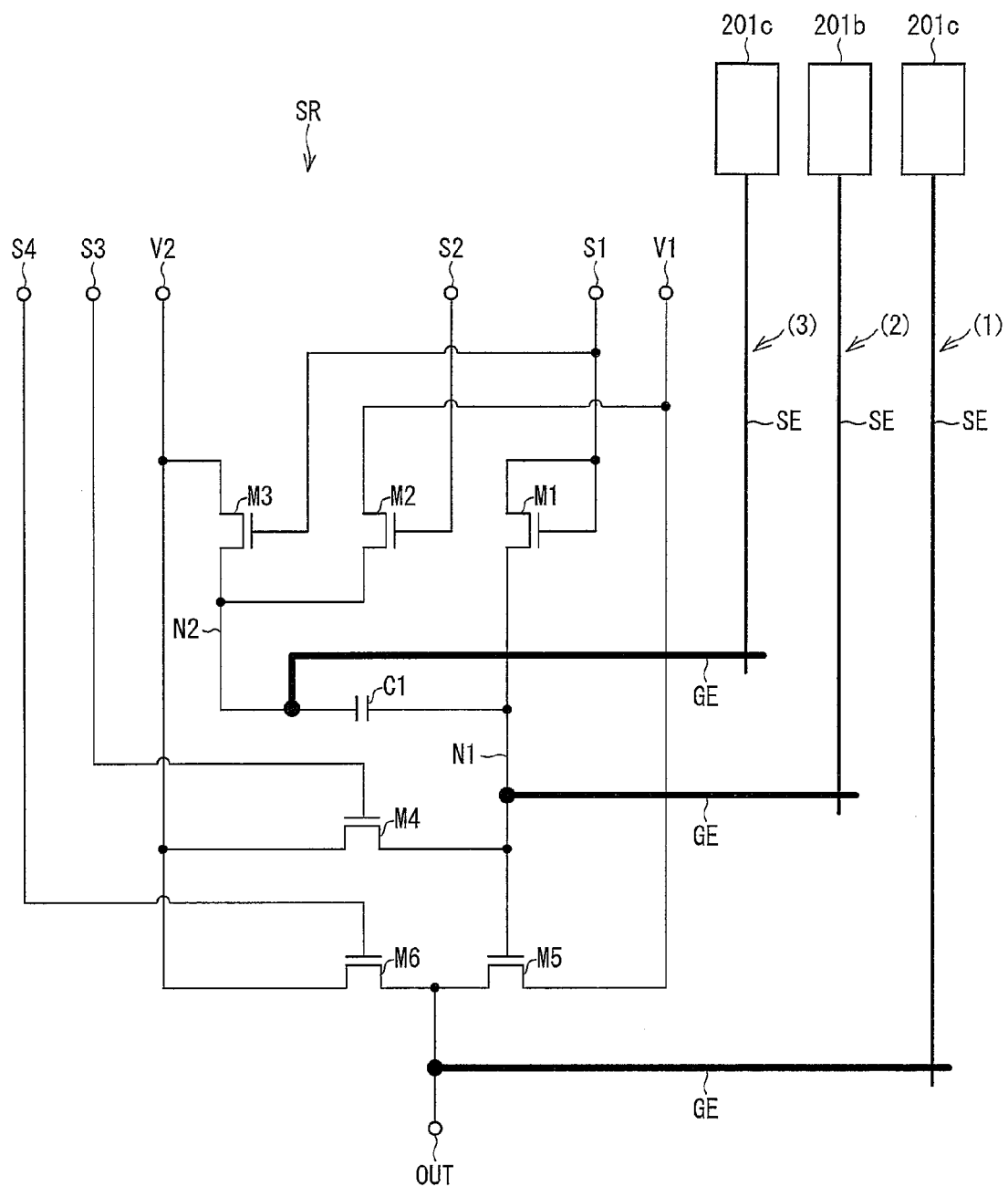
FIG. 14 is a circuit view showing a configuration of an electronic device which is another comparative example to the present invention.

In order to overcome such a difficulty, it is good to provide test line groups (1) through (3), as shown in FIG. 14; the test line group (1) being connected with the output terminal OUT of the shift register SR, the test line group (2) being connected with a line N1 via which an output pulse (i.e., an inspection target) of the switching element M1 flows, and the test line group (3) being connected with a line N2 via which output pulses of the switching elements M2 and M3 flow. The test line groups (1) through (3) have same configurations as the test line group shown in FIG. 11. As such, the test line groups (1) through (3) are respectively connected with connection terminals 201a through 201c connectable with the outside device.

In a case where the test line groups (1) through (3) are provided as shown in FIG. 14, it is possible to inspect the output waveforms of the respective switching elements forming the shift register SR. However, such a configuration gives rise to a problem that, because a number of lines extended around the shift register SR is increased, a circuit density is decreased. Further, the number of connection terminals for connection with the outside device is increased.

Figure 1:
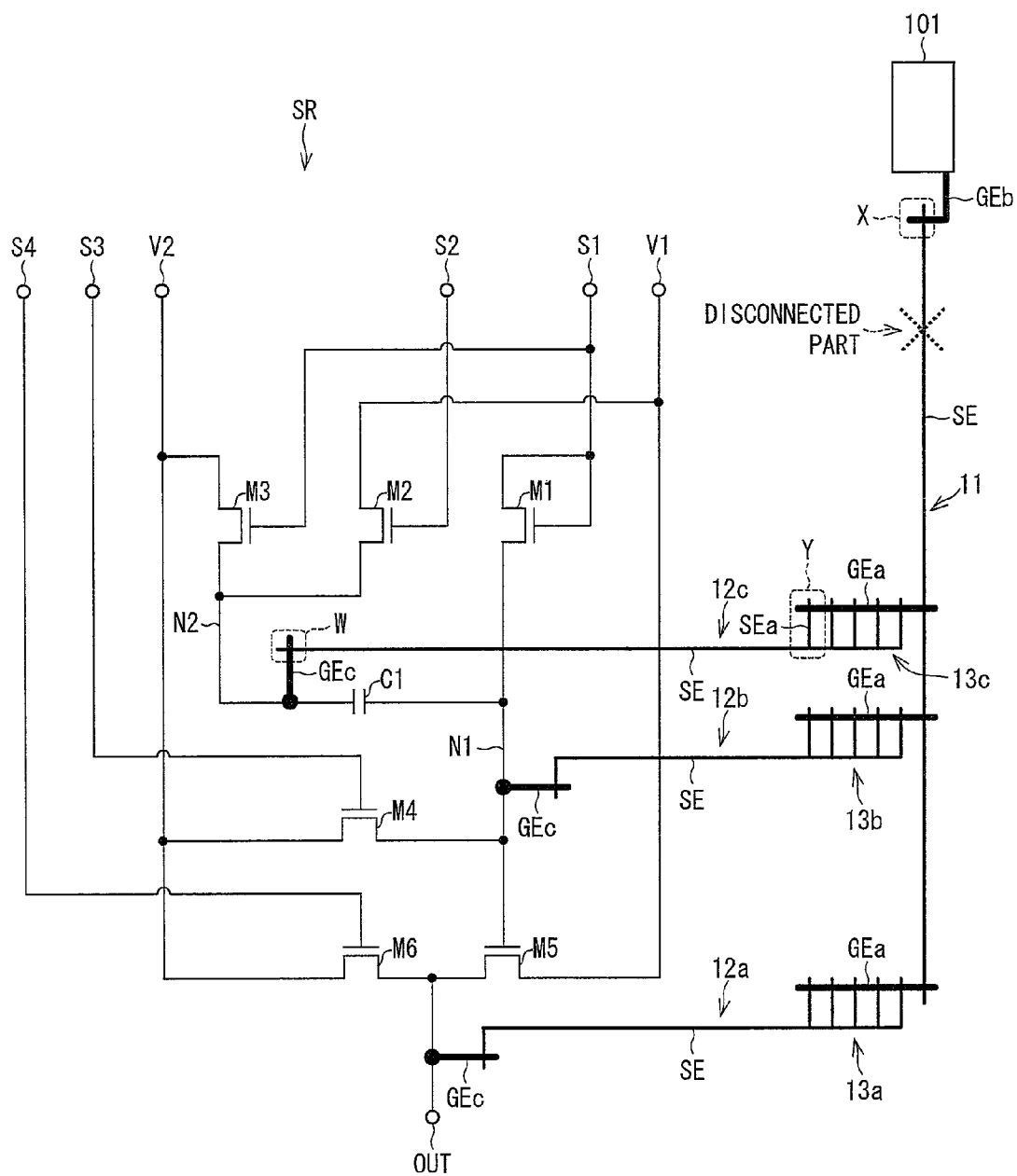
FIG. 1 is a circuit view showing a configuration of an electronic device according to an embodiment of the present invention.
Figure 2:
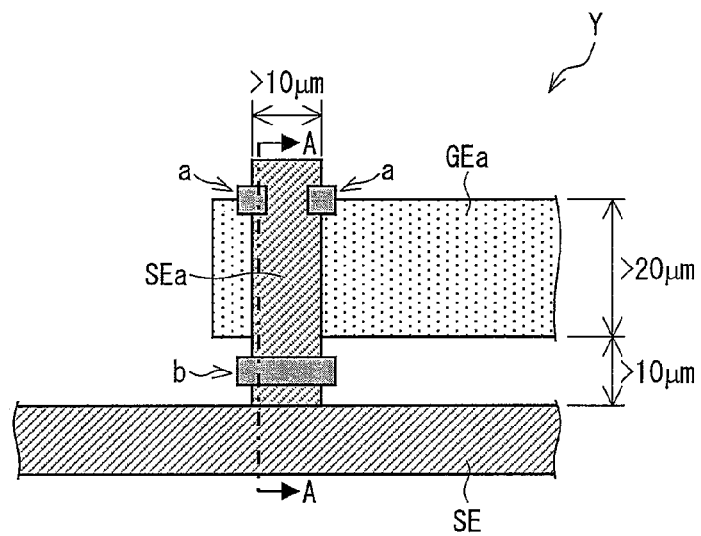
FIG. 2 is an enlarged view showing a main part of the electronic device shown in FIG. 1.
Figure 3:
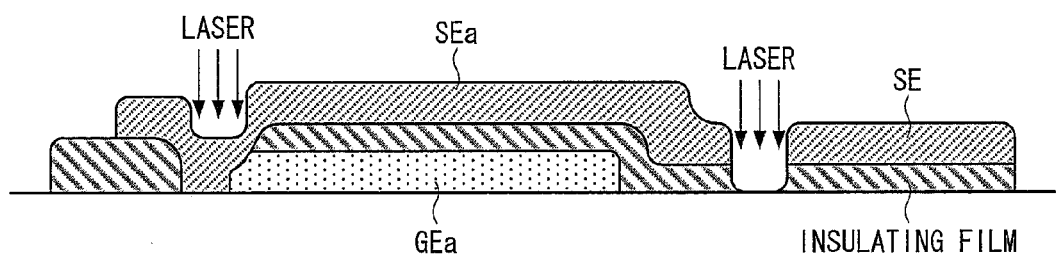
FIG. 3 is a cross sectional view of the electronic device, taken along the line AA in FIG. 2.

As a countermeasure to this problem, the present embodiment proposes an electronic device shown in FIGS. 1 through 3.

FIG. 1 is a view showing an example that an electronic circuit included in the electronic device is a shift register SR to which a test line pattern is provided. FIG. 2 is an enlarged view showing a region Y which is a main part of the shift register SR shown in FIG. 1. FIG. 3 is a cross sectional view taken along the line AA in the enlarged view of FIG. 2.

That is, as shown in FIG. 1, the electronic device at least includes (i) a first line 11 connected with a connection terminal 101 electrically connectable with an outside device provided independently of the shift register SR, (ii) second lines 12a through 12c via which output waveforms at three different locations in the shift register SR are extracted to an outside of the shift register SR, and (iii) switching sections 13a through 13c by which the first line 11 and the second lines 12a through 12c are switched between the electrically connected condition and the electrically disconnected condition for predetermined times.

In the electronic device shown in FIG. 1, the second lines 12a through 12c are provided so that the three different output waveforms, i.e., the output waveform at the output terminal OUT of the shift register SR, the output waveform of the switching element M1, and the output waveforms of the switching elements M2 and M3, are extracted to the outside of the shift register SR.

Because the shift register SR in the electronic device shown in FIG. 1 has a common structure, detailed explanation of the structure of the shift register SR is omitted.

The following describes connection relationships between the first line 11 and the second lines 12a through 12c.

The first line 11 has one line SE as a main line, which one line SE is (i) made from a same material as materials of source electrodes of the respective switching elements forming the shift register SR and (ii) formed by same forming steps as the source electrodes of the respective switching elements. Three branch lines GEa branched from the line SE are provided so as to cross respective cross lines SEa, with an insulating film (which is not illustrated) being disposed between the three branch lines GEa and the cross lines SEa. The branch lines GEa are (i) made from same materials as materials of gate electrodes of the respective switching elements forming the shift register SR and (ii) formed by same forming steps as the gate electrodes of the respective switching elements. As such, the insulating film is provided between the branch lines GEa and the line SE. Thus, the branch lines GEa and the line SE are provided in different layers and are usually electrically disconnected with each other. In order for the line SE and the branch lines GEa to be switched from such electrically disconnected conditions to conditions in which they are electrically connected with each other, it is required that laser welding or the like be performed to the intersection regions of the branch lines GEa and the lines SE.

The line SE and the branch lines GEa are electrically disconnected with each other in initial conditions, as described above. This is because, with such a configuration, a noise signal sent via the line SE can be prevented from being inputted to the shift register via the branch lines GEa. Meanwhile, the branch lines GEa and the second lines 12 provided to the shift register SR are electrically disconnected with each other in initial states (this is later described). Thus, it can be thought that an adverse influence by the noise signal as described above is very small.

In consideration, it is not necessarily required that the line SE and the branch lines GEa be electrically disconnected with each other in the initial conditions. Alternatively, the line SE and the branch lines GEa may be integrally formed by same lines so that they are connected with each other in the initial conditions. That is, for example, the line SE and the branch lines GEa may be (i) made from same materials as the source electrodes of the respective switching elements of the shift register SR and (ii) integrally formed by same forming steps as the source electrodes of the respective switching elements of the shift register SR.

Further, the branch lines GEa may be provided in any number, provided that the number of the branch lines GEa is not smaller than the number of the second lines.

Each of the second lines 12a through 12c has two or more cross lines SEa •• crossing a corresponding one of the branch lines GE of the first line 11 in a corresponding one of the switching sections 13a through 13c. The cross lines SEa are (i) made from same materials as materials of the second lines 12a through 12c and (ii) formed integrally with the second lines 12a through 12c by same forming steps as forming steps of the second lines 12a through 12c.

The cross lines SEa have comb-like shapes or branch-like shapes as shown in figures. However, the cross lines SEa are not limited to this. It is satisfactory as long as each of the cross lines SEa diverges into a plurality of lines so as to cross a plurality of parts of the corresponding one of the branch lines GE.

The cross lines SEa of each of the second lines 12a through 12c are provided so as to be electrically connected with the corresponding one of the branch lines GEa on a one-by-one basis. Specifically, the cross lines SEa of each of the second lines 12a through 12c are provided so as to cross the corresponding one of the branch lines GEa, with an insulating film (which is not illustrated) being disposed between the cross lines SEa and the branch lines GEa.

The switching sections 13a through 13c are good as long as the first line and the second lines can be switched between the electrically connected condition and the electrically disconnected condition for the predetermined times. For example, in FIG. 1, five cross lines SEa are provided in each of the switching sections 13a through 13c so that the first line and the second lines can be switched between the electrically connected condition and the electrically disconnected condition for five times. Thus, by determining how many cross lines GEa are provided in each of the switching sections 12a through 12c, it is possible to determine how many times the first line and the second lines are switched between the electrically connected condition and the electrically disconnected condition in the respective switching sections 12a through 12c.

The "predetermined times" of switching mentioned above is counted by counting the following switching (i) as first counting and next switching (ii) as second switching, (i) the switching of the first line and the second lines from the electrically disconnected condition to the electrically connected condition (or from the electrically connected condition to the electrically disconnected condition) and (ii) the switching of the first line and the second lines from the electrically connected condition to the electrically disconnected condition (or from the electrically disconnected condition to the electrically connected condition).

Specifically, in the configuration above, the first line and the second lines are at first in the electrically disconnected condition in which they are electrically disconnected with each other. In such an event, the first switching switches the first line and the second lines from the electrically disconnected condition, in which they are electrically disconnected with each other, to the electrically connected condition, in which they are electrically connected with each other, on one cross line SEa. Then, the second switching switches the first line and the second lines from the electrically connected condition to the electrically disconnected condition on the same cross line SEa. It is possible that the operations are repeated for each of the five cross lines SEa (i.e., the operations are repeated for five times). Accordingly, the number of times that the first line and the second line are switched between the electrically connected condition and the electrically disconnected condition is ten ($2 \times 5 = 10$) times. It follows that the number of times that the first line and the second line are switched to the electrically disconnected condition is five times.

Thus, the output waveforms extracted via the respective second lines can be obtained as many times as the number of times that the first line and the second lines are switched to the electrically connected condition (in the example above, five times) out of the predetermined times of switching (in the example above, ten times).

In a case where the first line and the second lines are in the electrically connected condition at first, the number of times that they are switched between the electrically connected condition and the electrically disconnected condition is eleven ($1 + 2 \times 5 = 11$) times. In such an event, the predetermined times of switching is eleven times, of which six times are the times that the first line and the second lines are switched to the electrically connected condition. In this case, the output waveforms extracted via the respective second lines can be obtained for six times.

In the present embodiment, it is possible that the cross lines SEa and the branch lines GEa are switched between the electrically connected condition and the electrically disconnected condition for the predetermined times. Specifically, each of the cross lines SEa and a corresponding one of the branch lines GEa are switched to the electrically connected condition by performing laser irradiation to partial regions a•a (see FIG. 2) of an intersection of the cross line SEa and the branch line GEa and thereby laser-welding the cross line SEa and the branch line GEa, as shown in FIG. 3. On the other hand, the cross line SEa and the branch line GEa are switched to the electrically disconnected condition by performing laser irradiation to a region b (see FIG. 2) of the cross line SEa, which region b is located outside the intersection of the cross line SEa and the branch line GEa, and thereby disconnecting the cross line SEa, as shown in FIG. 3.

By providing two or more cross lines SEa of each second line 12, as described above, it is possible to repeat switching of the cross lines SEa and the branch lines GEa between the electrically connected condition and the electrically disconnected condition. That is, it is possible to perform predetermined times of switching of the first line 11 and the second lines 12a through 12c between the electrically connected condition and the electrically disconnected condition.

If it is assumed that the first line 11 and the second lines 12a through 12c are ultimately switched to the electrically connected condition, then there is no particular problem even in a case where the number of times that the first line 11 and the second lines 12a through 12c are switched between the electrically connected condition and the electrically disconnected condition is one time (i.e., the first line 11 and the second lines 12a through 12c are switched from the electrically connected condition to the electrically disconnected condition only). However, it is preferable that the first line 11 and the second lines 12a through 12c be switched to the electrically connected condition for plural times, i.e., two or more times. This is because, if the first line 11 and the second lines 12a through 12c are switched between the electrically connected condition and the electrically disconnected condition for plural times, i.e., they are switched to the electrically connected condition for two or more times, then output waveforms extracted via the respective second lines 12a through 12c can be obtained for two or more times.

In the configuration, even in a case where the number of extraction targets (which are output waveforms in the shift register SR (electronic circuit)) are increased, it is only required that the number of the second lines are increased, while the number of the first line can be one irrespectively of the increase in the number of extraction targets. This brings about an effect of preventing a decrease in a circuit density.

The connection terminal 101 is connected with a terminal line GEb provided in a same layer as the branch lines GEa. The terminal line GEb is provided so as to cross the line SE (i.e., the main line of the first line 11,) in a region X with an insulating film (which is not illustrated) being disposed between the terminal line GEb and the line Se. The region X is, similarly to the region Y, subjected to laser welding so that the line SE and the terminal line GEb are electrically connected with each other.

In the configuration, the terminal line GEb and the line SE (i.e., the main line of the first line 11) are prevented from being electrically connected with each other, before it is required that they are electrically connected with each other. Thus, no unnecessary signal from the connection terminal 101, which is connected with the outside device, is inputted via the line SE. Thus, it is possible that the adverse influence by the unnecessary signal is hardly exerted on the shift register SR on a downstream side.

The second lines 12a through 12c are provided so as to cross respective leading lines GEc via an insulating film (which is not illustrated) in respective regions W, the leading lines GEc being electrically connected with different lines (N1, N2, etc) via which output waveforms of the shift register SR, i.e., extraction targets, flow. The regions W are, similarly to the region X, subjected to laser welding so that the second lines 12a through 12c and the respective leading lines GEc are electrically connected with each other.

In this case, similarly to a relationship between the line SE and the terminal line GEb connected with the connection terminal 101, the second lines 12a through 12c and the respective leading lines GEc of the shift register SR are prevented from being electrically connected with each other, before it is required that they are electrically connected with each other. Hence, no unnecessary signal is inputted to the shift register SR via the second lines 12a through 12. Therefore, it is possible to bring about an effect that an adverse influence by the unnecessary signal is hardly exerted on the shift register SR.

It is preferable that the leading lines GEc have such lengths that a capacitance formed at an intersection of the second line 12a and a corresponding one of the leading lines GEc is not greater than a predetermined value.

Because the leading lines GEc thus have such lengths that the capacitance formed at the intersection of the second line 12a and the corresponding one of the leading lines GEc is not greater than the predetermined value, it is possible to minimize an adverse influence by the capacitance formed at the intersection, such as a waveform distortion or the like.

In drive circuits included in the liquid crystal display device, shift registers SR are connected with each other in series as shown in FIGS. 5 and 6. As for a shift register SR at a first stage of the serial connection of the shift registers SR, a result of inspecting of output waveforms extracted via a first line 11 and second lines 12a through 12c as shown in FIG. 1 is equivalent to a result of inspecting of a normal operation of the shift register SR. On the other hand, as for a shift register SR at a last stage of the serial connection of the shift registers SR, a result of inspecting of output waveforms extracted via a first line 11 and the second lines 12a through 12c as shown in FIG. 1 is equivalent to a result of inspecting of output waveforms whose waveform changes are greatest among output waveform changes in the entire drive circuits.

Hence, in a case where the shift registers SR are connected with each other in series, the first line 11 and the second lines 12a through 12c may be provided to the shift register SR at the first or last stage of the serial connection of the shift registers SR, or the shift registers SR at the first and last stages of the serial connection shift registers SR, as appropriate in accordance with necessity.

FIG. 1 shows an example that the cross lines SEa are extended from the second lines 12a through 12c and cross the branch lines GEa of the first line 11. However, the cross lines SEa are not limited to this. In contrast to the example shown in FIG. 1, the cross lines SEa may be extended from the branch lines GEa. In this case, the cross lines SEa are made from same materials as the materials of the branch lines GEa and formed by same forming steps as the forming steps of the branch lines GEa. Thus, the cross lines SEa are parts of the first line 11.

That is, either in the following case (i) or (ii), the cross lines are good as long as they are provided so as to be electrically connected with a corresponding one of the branch lines on a one-by-one basis, (i) the case that the first line 11 has the branch lines GEa branched from the line SE (which is the main line of the first line 11) and each of the second lines 12a through 12c has two or more cross lines SEa crossing a corresponding one of the branch lines GEa in a corresponding one of the switching sections 13a through 13c (the case which is illustrated in FIG. 1) or (ii) the case that each of the branch lines GEa of the first line 11 has two or more cross lines crossing a corresponding one of the second lines 12a through 12c in a corresponding one of the switching sections 13a through 13c (the case which is not illustrated).

In the electronic device configured as above, by disconnecting the main line SE of the first line 11 (see FIG. 1) after an inspection, it is possible to block a noise from the outside, to prevent electrostatic breakdown, to prevent a competitor from measuring an output waveform obtained from the connection terminal 101 (i.e., to preserve confidentiality). Where the main line SE of the first line 11 is disconnected can be freely determined, provided that a disconnection part of the main line SE is located between the connection terminal 101 and the branch lines GEa branched from the main line SE of the first line 11.

That is, the first line 11 may be disconnected at a position not in the cross sections 13a through 13c by which the first line 11 and the second line 12a through 12c are electrically connected or disconnected with each other.

With this, it is possible to prevent a noise and a static electricity inputted from the connection terminal 101 connectable with the outside device from entering the electronic circuit via the first line 11 connected with the connection terminal 101. Therefore, it is possible to prevent an adverse influence by the noise on the electronic circuit and electrostatic breakdown of the electronic circuit. Further, in a case where the first line 11 is disconnected at the disconnection part above, no output waveform in the electronic circuit can be obtained outside the electronic circuit via the connection terminal 101. Therefore, it is impossible for a third party to analyze the electronic circuit provided inside the electronic device. Hence, it is possible to prevent information leakage and to preserve confidentiality of the configuration of the electronic circuit.

In order to prevent unauthorized obtaining of output waveforms outside the electronic device and to minimize the disconnection part of the first line 11, it is preferable to disconnect the first line 11 at a position between the connection terminal 101 and one of the switching sections which is closest to the connection terminal 101 (i.e., it is preferable to disconnect the first line 11 at a position indicated by the dashed x mark in FIG. 1).

Figure 7:
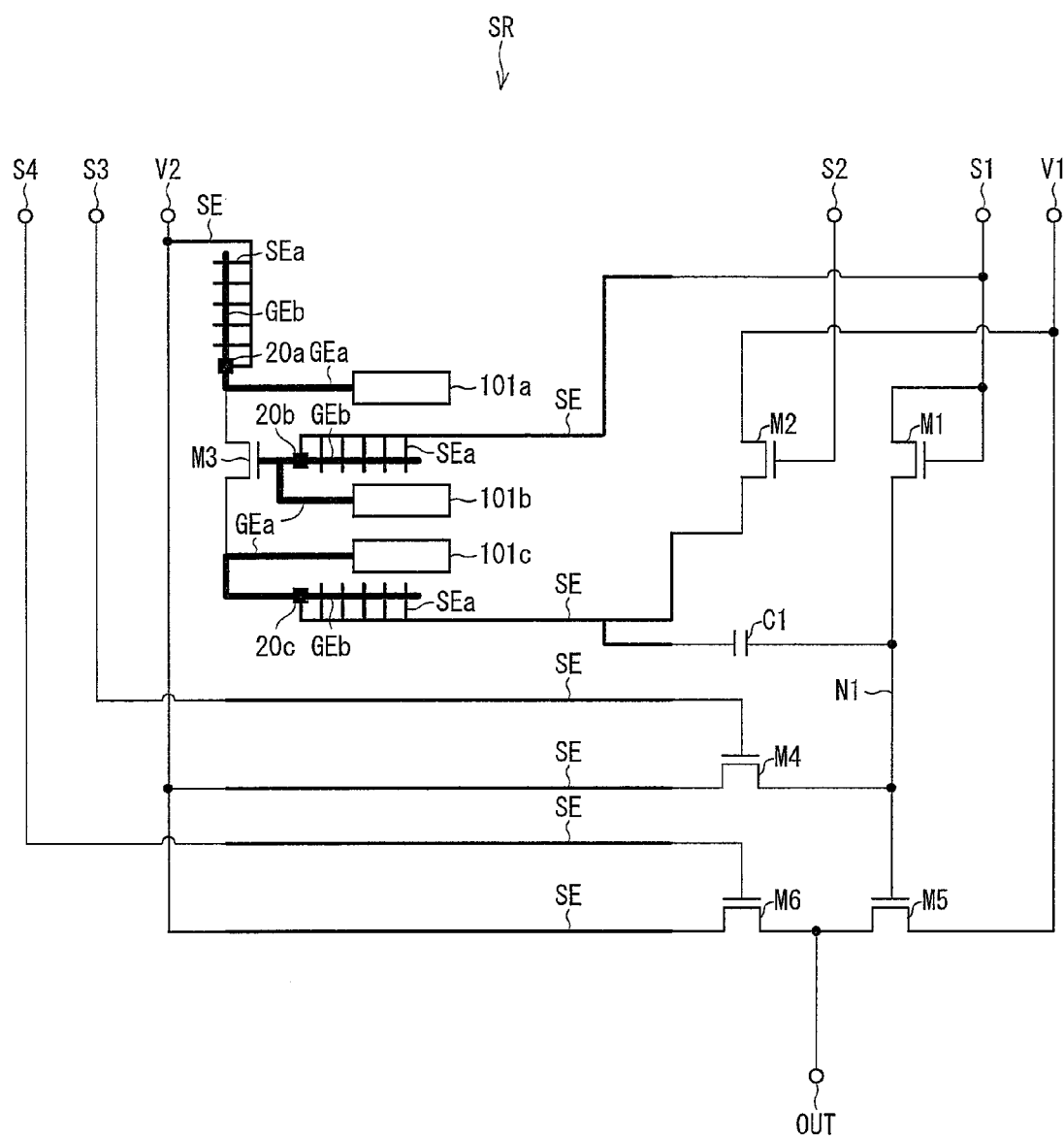
FIG. 7 is a circuit view showing a circuit configuration of another electronic device according to the embodiment of the present invention.

FIGS. 1 through 3 show exemplary configurations enabling inspection of the output waveforms of the shift register SR. With application of the technical concept of the present invention, it is even possible to inspect signals inputted to or outputted from electrodes of transistors forming the shift register SR. This is described below with reference to FIG. 7. A basic configuration of a shift register SR shown in FIG. 7 is same as that of the shift register SR shown in FIG. 1 and hence common. Thus, detailed explanation of it is not repeated.

As shown in FIG. 7, signal lines connected respectively with a source electrode, a drain electrode, and a gate electrode of a transistor M3 included in the shift register SR are each diverged into a first branch line GEa and a second branch line GEb. The first branch lines GEa of the signal lines are connected with respective connection terminals 101a through 101c electrically connectable with an outside device. Switching sections 21a through 21c are provided, in which (i) the second branch lines GEb of the signal lines and (ii) the lines SE for supplying signals to and outputting signals from the electrode of the transistor M3, are switched between an electrically connected condition and an electrically disconnected condition.

In the configuration, the signals supplied to and outputted from the electrodes of the transistor M3 can be obtained from the connection terminals 101a through 101c. Therefore, in a case where a failure of the shift register is detected, it is easy to identify a cause of the failure.

Each of the lines SE has two or more cross lines SEa crossing a corresponding one of the second branch lines GEb in a corresponding one of the switching sections 21a through 21c. The two or more cross lines SEa of each of the lines SE are provided so as to be electrically connected with the corresponding one of the second branch lines GEb on a one-by-one basis.

According to the configuration, because the two or more cross lines SEa of each of the lines SE are provided so as to be electrically connected with the corresponding one of the second branch lines GEb on the one-by-one basis, it is possible to inspect output waveforms of the respective electrodes of the transistor for two or more times.

Further, the cross lines SEa are provided above or below the second branch lines, with an insulating film being disposed between the cross lines SEa and the second branch lines. In this case, the cross lines SEa and the second branch lines can be electrically connected with each other by performing laser welding or the like to intersections of the cross lines SEa and the second branch lines.

As shown in FIG. 7, the second branch lines GEb and the cross lines SEa may be electrically connected with each other via contact holes 20a through 20c at first so that an operation of the entire drive circuit including the shift register SR can be inspected. After inspecting the operation of the entire drive circuit, it is even possible to perform inspection (inspecting of output waveform, etc) on each of the electrodes independently, by disconnecting the cross lines SEa in regions where they are connected with the respective contact holes 20a through 20c.

In the example above, the transistor M3 out of transistors of the shift register SR is described. However, the present embodiment is not limited to this. Instead of the transistor M3, any of transistors M1 M2, and M4 through 6 may be connected with line patterns similar to those connected with the transistor M3. With this, it is possible to inspect signals inputted to and outputted from electrodes of any of the transistors M1, M2, and M4 through M6.

The configuration shown in FIG. 7 exemplifies a case that each of the signal lines SE has two or more cross lines SEa crossing the corresponding one of the second branch lines GEb in the corresponding one of the switching sections 21a through 21c, and the two or more cross lines SEa of each of the signal lines SE are provided so as to be electrically connected with the corresponding one of the second branch lines GEb on a one-by-one basis. However, the present embodiment is not limited to this. For example, each of the second branch lines GEb may have two or more cross lines (which are not illustrated) crossing a corresponding one of the lines SE. In this case in a corresponding one of the switching sections 21a through 21c, the two or more cross lines of each of the second branch lines GEb are good as long as they are provided so as to be electrically connected with the corresponding one of the signal lines SE on the one-by-one basis.

Further, in a case where each of the second branch lines GEb has the two or more cross lines (which are not illustrated) crossing the corresponding one of the lines SE in the corresponding one of the switching sections 21a through 21c and, the two or more cross lines of each of the second branch lines GEb are provided above or below the lines SE via an insulating film.

In FIGS. 5 and 6, there is a problem described as follows. In order for clock signals cks, ckg, which are respectively inputted to shift register circuits 1 and 2 shown in FIGS. 5 and 6, and the like to have increased amplitudes, it is required that power consumption in an outside circuit, such as a control circuit CTL (see FIG. 4) for generating the clock signals and the like, be increased. Also, spurious radiation by signal lines poses a serious problem.

As a countermeasure to these, level shifter circuits (signal booster circuits) are provided to the drive circuits SD and GD of the liquid crystal display device. This can solve the problem caused due to the increases in the amplitudes of the clock signals cks, ckg, and the like. An example of this is described in Embodiment 2 below.

Embodiment 2

Another embodiment of the present invention is described below. In the present embodiment, explanations of members having like functions as the members of Embodiment 1 are not repeated. Hence, reference signs SE and GE are given to lines and electrodes in same ways as in Embodiment 1 so that the reference signs SE are used as reference signs indicating lines and electrodes which are made from same materials as materials of source electrodes and formed by same forming steps as forming steps of the source electrodes, whereas the reference signs GE are used as reference signs indicating lines and electrodes which are made from same materials as materials of gate electrodes and formed by same forming steps as forming steps of the gate electrodes.

Figure 8:
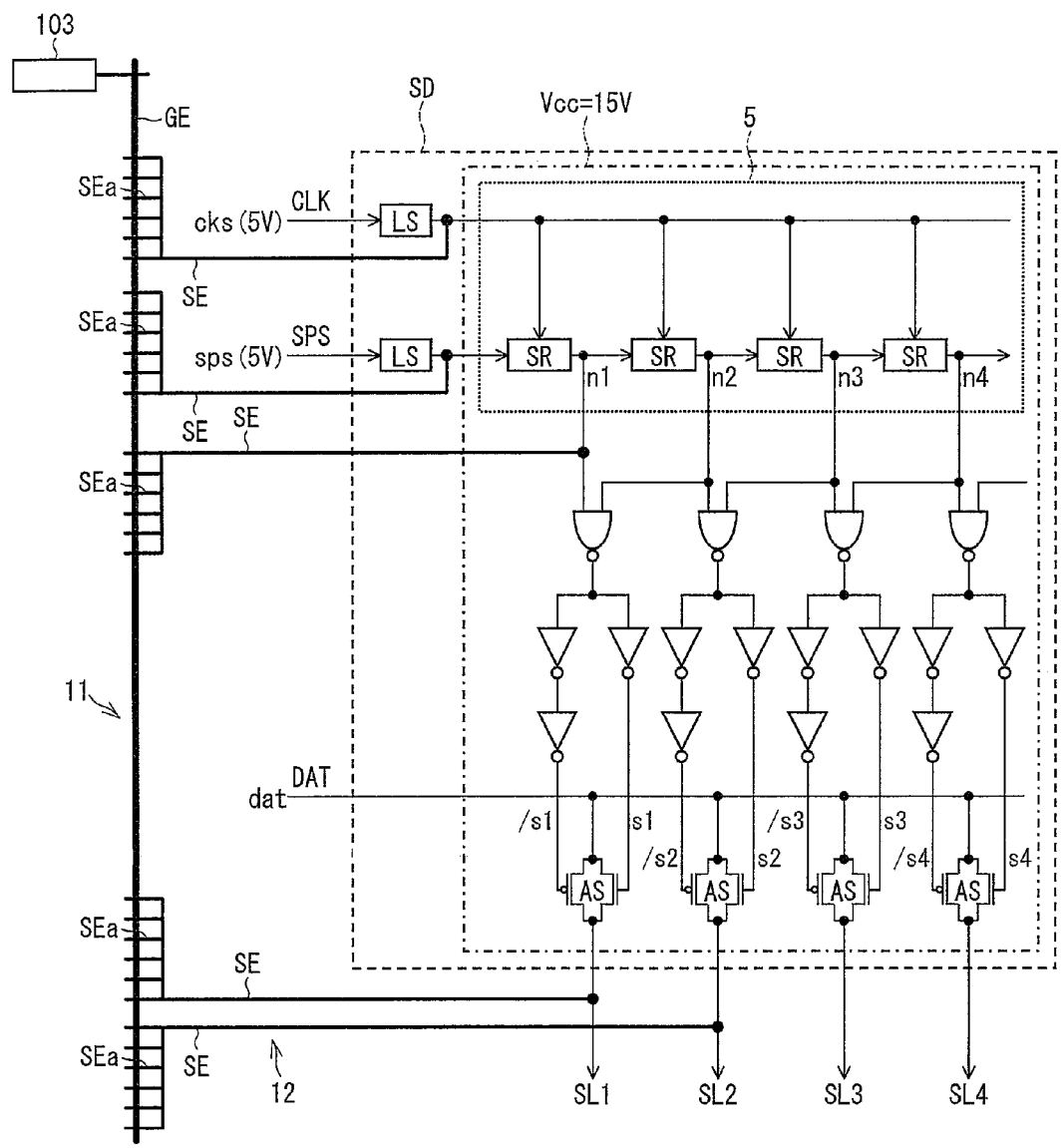
FIG. 8 is a circuit view showing another configuration of the data signal line drive circuit included in the liquid crystal display device shown in FIG. 4.

FIG. 8 is a circuit view showing a configuration of a data signal line drive circuit SD according to the present embodiment.

Figure 9:
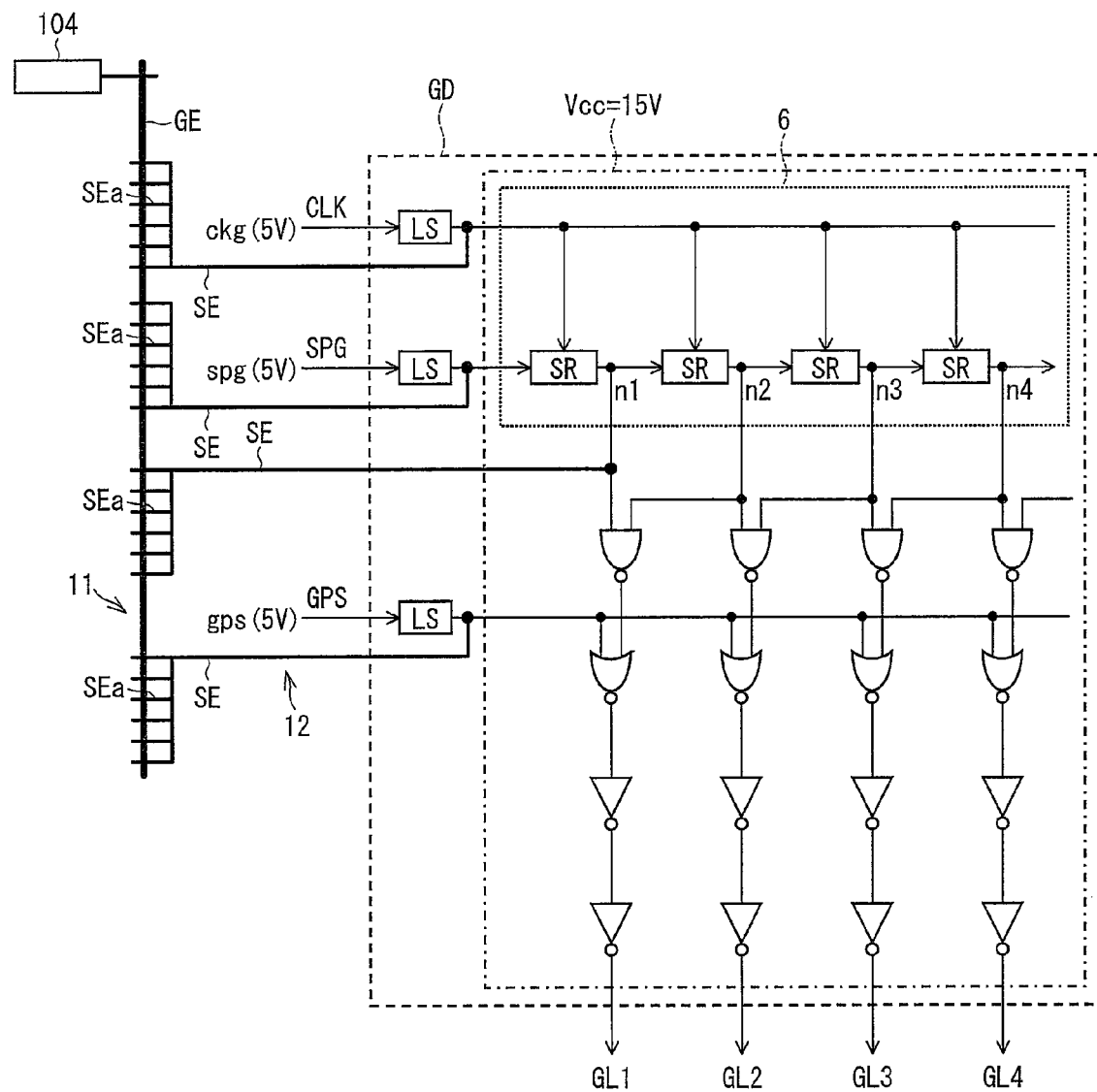
FIG. 9 is a circuit view showing another configuration of the scanning signal line drive circuit included in the liquid crystal display device shown in FIG. 4.

FIG. 9 is a circuit view showing a configuration of a scanning signal line drive circuit GD according to the present embodiment.

FIG. 10 is a circuit view showing a configuration of each of level shifters LS shown in FIGS. 8 and 9.

The data signal line drive circuit SD shown in FIG. 8 includes a shift register circuit 5 having a configuration similar to the shift register circuit 1 of the data signal line drive circuit SD shown in FIG. 5. The level shifters LS are provided on respective sides from one of which a clock pulse CLK is inputted to the shift register circuit 5 and from the other of which a start pulse SPS is inputted to the shift register circuit 5.

The data signal line circuit SD shown in FIG. 8 has a configuration similar to the data signal line drive circuit SD shown in FIG. 5, except for the configurations of the level shifters LS.

The scanning signal line drive circuit GD shown in FIG. 9 includes a shift register circuit 6 having a configuration similar to the shift register circuit 2 of the scanning signal line drive circuit GD shown in FIG. 6. The scanning signal line drive circuit GD shown in FIG. 9 also includes level shifters LS, one of which is provided on a side from which a clock pulse CLK is inputted to the shift register circuit 6, another of which is provided on a side from which a start pulse SPS is inputted to the shift register circuit 6, and the other of which is provided on a side from which an input is inputted to NOR circuits.

The scanning signal line drive circuit GD shown in FIG. 9 has a configuration similar to the configuration of the scanning signal line drive circuit GD shown in FIG. 6, except for the configurations of the level shifters LS.

FIG. 10 is the circuit view showing the configuration of each of the level shifters LS. That is, each of the level shifters LS includes members M1 and M2 which are p-type transistors and members M3 and M4 which are n-type transistors.

In each of the circuits shown in FIGS. 8 through 10, similarly to the circuit of Embodiment 1 shown in FIG. 1, a first line and second lines are provided. Relationships between the first line and the second lines are same as the relationships between the first line and the second lines in Embodiment 1. That is, the second lines are provided for extracting output waveforms, the first line that is connected with a connection terminal electrically connectable with an outside device is provided, and the first line and second lines are switched between an electrically connected condition and an electrically disconnected condition.

That is, an electronic device including a data signal line drive circuit SD shown in FIG. 8 includes second lines 12 via which the following output waveforms (i) through (iii) are obtained outside; (i) the output waveforms of two level shifters LS, (ii) the output waveform of a shift register SR at a first stage of serial connection of shift registers SR, and (iii) the output waveforms of analog switches AS corresponding to the shift register SR at the first stage of the serial connection of the shift registers SR and a shift register SR at a second stage of the serial connection of shift registers SR. Each of the second lines 12 has a plurality of cross lines SEa crossing a first line 11 connected with a connection terminal 103 electrically connectable with an outside device. An insulating film (which is not illustrated) is provided between the cross lines SEa and the first line 11. With this, as early described in Embodiment 1, the cross lines SEa and the first line 11 can be switched between an electrically connected condition and an electrically disconnected condition, as appropriate in accordance with necessity.

That is, in the electronic device shown in FIG. 8, it is possible that output waveforms at intended locations are inspected by switching, between the electrically connected condition and the electrically disconnected condition, (i) the second lines 12 via which the output waveforms at the intended locations in the data signal line drive circuit SD are extracted and (ii) the first line connected with the connection terminal 103 electrically connectable with the outside device.

Similarly to the electronic device shown in FIG. 8, in an electronic device including a scanning signal line drive circuit GD shown in FIG. 9, it is possible that output waveforms at intended locations are inspected by switching, between an electrically connected condition and an electrically disconnected condition, (i) second lines 12 via which the output waveforms at the intended locations in a data signal line drive circuit SD are extracted and (ii) a first line 11 connected with a connection terminal 104 electrically connectable with an outside device.

An electronic device including a level shifter LS shown in FIG. 10 includes two second lines 12 via which two different output waveforms are extracted. Each of the second lines 12 has a plurality of cross lines SEa crossing a first line 11 connected with a connection terminal 105 electrically connectable with an outside device. An insulating film (which is not illustrated) is provided between the pluralities of cross lines SEa and the first line 11.

Similarly to the electronic device shown in FIG. 8, in the electronic device including a level shifter LS shown in FIG. 10, it is possible that output waveforms at intended locations are inspected by switching, between an electrically connected condition and an electrically disconnected condition, (i) the second lines 12 via which the output waveforms at the intended locations in a data signal line drive circuit SD are extracted and (ii) the first line 11 connected with the connection terminal 105 electrically connectable with the outside device.

As described so far, in the present embodiment, output waveforms in an electronic circuit can be extracted and easily inspected, which has been difficult with an electronic device having a monolithic structure that electronic circuits are provided integrally with a substrate. Thus, for example, for inspection of the electronic device for an operation failure after manufacturing, it is possible to inspect output waveforms of the electronic device. Hence, in a case where the operation failure is detected, it is easy to identify where the operation failure occurs. It is possible to repeat switching of the lines, which are provided for extraction of the output waveforms, between the electrically connected condition and the electrically disconnected condition. Hence, the output waveforms can be inspected even before the electronic device is fully manufactured. Therefore, even before the electronic device is fully manufactured, it is easy to identify where the operation failure occurs. Thus, it is possible to perform suitable feedback within manufacturing processes, and this can improve a yield ratio of the electronic device.

The present invention is not limited to the description of the embodiments above, but may be altered by a skilled person within the scope of the claims. An embodiment based on a proper combination of technical means disclosed in different embodiments is encompassed in the technical scope of the present invention.

INDUSTRIAL APPLICABILITY

The present invention can be applied to any electronic device having a so-called monolithic structure that electronic circuits are provided integrally with a substrate.

REFERENCE SIGNS LIST

1: shift register circuit
2: shift register circuit
5: shift register circuit
6: shift register circuit
10: liquid crystal display device
11: first line
12: second line
12a through 12c: second line
13a through 13c: switching section
20a through 20c: contact hole
21a through 21c: switching section
101: connection terminal
101a through 101c: connection terminal
103: connection terminal
104: connection terminal
105: connection terminal
201: connection terminal
201a through 201c: connection terminal

The invention claimed is:

1. An electronic device comprising:
an electronic circuit provided integrally with a substrate;
a first line connected with a connection terminal electrically connectable with an outside device provided independently of the electronic circuit;
a second line via which an output waveform of the electronic circuit is extracted to an outside of the electronic circuit; and
a switching section by which the first line and the second line are switched between an electrically connected condition and an electrically disconnected condition for predetermined times; wherein
in a case where (i) the first line has a branch line branched from a main line and the second line has two or more cross lines crossing the branch line in the switching section, or (ii) the first line has a branch line branched from a main line, the branch line having two or more cross lines crossing the second line in the switching section,
the two or more cross lines are electrically connectable with the branch line or the second line on a one-by-one basis.

2. The electronic device as set forth in claim 1, wherein in the case (i) or (ii), the two or more cross lines are provided above or below the branch line or the second line with an insulating film being disposed between the two or more cross lines and the branch line or the second line.

3. The electronic device as set forth in claim 1, wherein the main line of the first line crosses a terminal line with an insulating film being disposed between the main line of the first line and the terminal line, the terminal line being connected with the connection terminal.

4. The electronic device as set forth in claim 1, wherein each second line crosses a leading line with an insulating film being disposed between the second line and the leading line, the leading line being electrically connected with a corresponding line on which the output waveform to be extracted from the electronic circuit is applied.

5. The electronic device as set forth in claim 4, wherein the leading line has such a length that a capacitance formed at an intersection of the leading line and the second line is not greater than a predetermined value.

6. The electronic device as set forth in claim 1, wherein the electronic circuit includes electronic circuits connected with each other in series, the first line and the second line(s) are provided to an electronic circuit at a last stage of the serial connection of the electronic circuits.

7. The electronic device as set forth in claim 1, wherein the electronic circuit includes electronic circuits connected with each other in series, the first line and the second line(s) are provided to an electronic circuit at a first stage of the serial connection of the electronic circuits.

8. The electronic device as set forth in claim 1, wherein the electronic circuit is a shift register.

9. The electronic device as set forth in claim 1, wherein the first line is disconnected at a position that is not in the switching section by which the first line is connected or disconnected with the second line.

10. An electronic device comprising:
an electronic circuit provided integrally with a substrate;
a first line connected with a connection terminal electrically connectable with an outside device provided independently of the electronic circuit;
a second line via which an output waveform of the electronic circuit is extracted to an outside of the electronic circuit; and
a switching section by which the first line and the second line are switched between an electrically connected condition and an electrically disconnected condition for predetermined times; wherein
the second line includes second lines provided for different types of output waveforms of the electronic circuit;
the first line has branch lines branched from a main line, the number of the branch lines being equal to or greater than the number of the second lines;
the second lines are connectable with the branch lines in respective switching sections; and
the branch lines are provided so as to cross the main line of the first line, with an insulating film being disposed between the branch lines and the main line of the first line.

11. The electronic device as set forth in claim 10, wherein the main line of the first line crosses a terminal line with an insulating film being disposed between the main line of the first line and the terminal line, the terminal line being connected with the connection terminal.

12. The electronic device as set forth in claim 10, wherein each second line crosses a leading line with an insulating film being disposed between the second line and the leading line, the leading line being electrically connected with a corresponding line on which the output waveform to be extracted from the electronic circuit is applied.

13. The electronic device as set forth in claim 12, wherein the leading line has such a length that a capacitance formed at an intersection of the leading line and the second line is not greater than a predetermined value.

14. The electronic device as set forth in claim 10, wherein the electronic circuit includes electronic circuits connected with each other in series, the first line and the second line(s) are provided to an electronic circuit at a last stage of the serial connection of the electronic circuits.

15. The electronic device as set forth in claim 10, wherein the electronic circuit includes electronic circuits connected with each other in series, the first line and the second line(s) are provided to an electronic circuit at a first stage of the serial connection of the electronic circuits.

16. The electronic device as set forth in claim 10, wherein the electronic circuit is a shift register.

17. The electronic device as set forth in claim 10, wherein the first line is disconnected at a position that is not in the switching section by which the first line is connected or disconnected with the second line.

18. An electronic device comprising:
an electronic circuit provided integrally with a substrate;
a first line connected with a connection terminal electrically connectable with an outside device provided independently of the electronic circuit;
a second line via which an output waveform of the electronic circuit is extracted to an outside of the electronic circuit; and
a switching section by which the first line and the second line are switched between an electrically connected condition and an electrically disconnected condition for predetermined times; wherein
the main line of the first line crosses a terminal line with an insulating film being disposed between the main line of the first line and the terminal line, the terminal line being connected with the connection terminal.

19. The electronic device as set forth in claim 18, wherein each second line crosses a leading line with an insulating film being disposed between the second line and the leading line, the leading line being electrically connected with a corresponding line on which the output waveform to be extracted from the electronic circuit is applied.

20. The electronic device as set forth in claim 19, wherein the leading line has such a length that a capacitance formed at an intersection of the leading line and the second line is not greater than a predetermined value.

21. The electronic device as set forth in claim 18, wherein the electronic circuit includes electronic circuits connected with each other in series, the first line and the second line(s) are provided to an electronic circuit at a last stage of the serial connection of the electronic circuits.

22. The electronic device as set forth in claim 18, wherein the electronic circuit includes electronic circuits connected with each other in series, the first line and the second line(s) are provided to an electronic circuit at a first stage of the serial connection of the electronic circuits.

23. The electronic device as set forth in claim 18, wherein the electronic circuit is a shift register.

24. The electronic device as set forth in claim 18, wherein the first line is disconnected at a position that is not in the switching section by which the first line is connected or disconnected with the second line.

25. An electronic device comprising:
an electronic circuit provided integrally with a substrate;
a first line connected with a connection terminal electrically connectable with an outside device provided independently of the electronic circuit;
a second line via which an output waveform of the electronic circuit is extracted to an outside of the electronic circuit; and
a switching section by which the first line and the second line are switched between an electrically connected condition and an electrically disconnected condition for predetermined times; wherein
each second line crosses a leading line with an insulating film being disposed between the second line and the leading line, the leading line being electrically connected with a corresponding line on which the output waveform to be extracted from the electronic circuit is applied.

26. The electronic device as set forth in claim 25, wherein the leading line has such a length that a capacitance formed at an intersection of the leading line and the second line is not greater than a predetermined value.

27. The electronic device as set forth in claim 25, wherein the electronic circuit includes electronic circuits connected with each other in series, the first line and the second line(s) are provided to an electronic circuit at a last stage of the serial connection of the electronic circuits.

28. The electronic device as set forth in claim 25, wherein the electronic circuit includes electronic circuits connected with each other in series, the first line and the second line(s) are provided to an electronic circuit at a first stage of the serial connection of the electronic circuits.

29. The electronic device as set forth in claim 25, wherein the electronic circuit is a shift register.

30. The electronic device as set forth in claim 25, wherein the first line is disconnected at a position that is not in the switching section by which the first line is connected or disconnected with the second line.

* * * * *